United States Patent
Sato

(10) Patent No.: US 6,236,106 B1
(45) Date of Patent: May 22, 2001

(54) WIRING STRUCTURE WITH DIVIDED WIRING CONDUCTORS TO ACHIEVE PLANARITY IN AN OVERLYING SOG LAYER

(75) Inventor: Natsuki Sato, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 08/979,685

(22) Filed: Nov. 26, 1997

(30) Foreign Application Priority Data

Nov. 26, 1996 (JP) .................................................. 8-315116

(51) Int. Cl.⁷ ...................................................... H01L 23/58

(52) U.S. Cl. .......................... 257/638; 257/759; 257/760; 257/775

(58) Field of Search .................................... 257/632, 775, 257/715, 758, 760, 638, 692, 759; 438/626, 631, 637, 666, 623

(56) References Cited

U.S. PATENT DOCUMENTS

| 4,451,326 | * | 5/1984 | Gwozdz | 156/643 |
| 4,467,345 | * | 8/1984 | Ozawa | 357/68 |
| 4,962,061 | * | 10/1990 | Takata | 438/195 |
| 4,979,012 | * | 12/1990 | Brownell | 357/40 |
| 5,665,657 | * | 9/1997 | Lee | 438/624 |

OTHER PUBLICATIONS

Japanese Office Action dated Oct. 6, 1998; Unexamined Patent Applications (Kokai) Nos. 07–161720, 08–306771 and 01–265539 and English translation of red line material. Prior Art documents Unexamined Patent Application Publication (Kokai) Nos. 07–297191 and 03–270007.

* cited by examiner

Primary Examiner—Olik Chaudhuri
Assistant Examiner—Kurt Eaton
(74) Attorney, Agent, or Firm—Laff, Whitesel & Saret, Ltd.; J. Warren Whitesel

(57) ABSTRACT

A wiring structure for a semiconductor device comprises a first interlayer insulating film formed on a semiconductor substrate, first level wiring conductors formed on the first interlayer insulating film, a second interlayer insulating film formed to cover the first level wiring conductors and including a SOG film, and a second level wiring conductors formed on the second interlayer insulating film. A first level wiring conductor which is formed in a peripheral zone of a semiconductor chip and which has to have a wide line width, is divided into a plurality of divided wiring conductors having a narrow line width. Alternatively, the first interlayer insulating film in the peripheral zone of the semiconductor chip is etched by a predetermined thickness so that the first level wiring conductor located in the peripheral zone of the semiconductor chip is formed at a level lower than the first interlayer insulating film located in an inside of the semiconductor chip. Therefore, the first level wiring conductor located in the peripheral zone of the semiconductor chip is constituted of a set of the divided wiring conductors having the narrow line width.

8 Claims, 8 Drawing Sheets

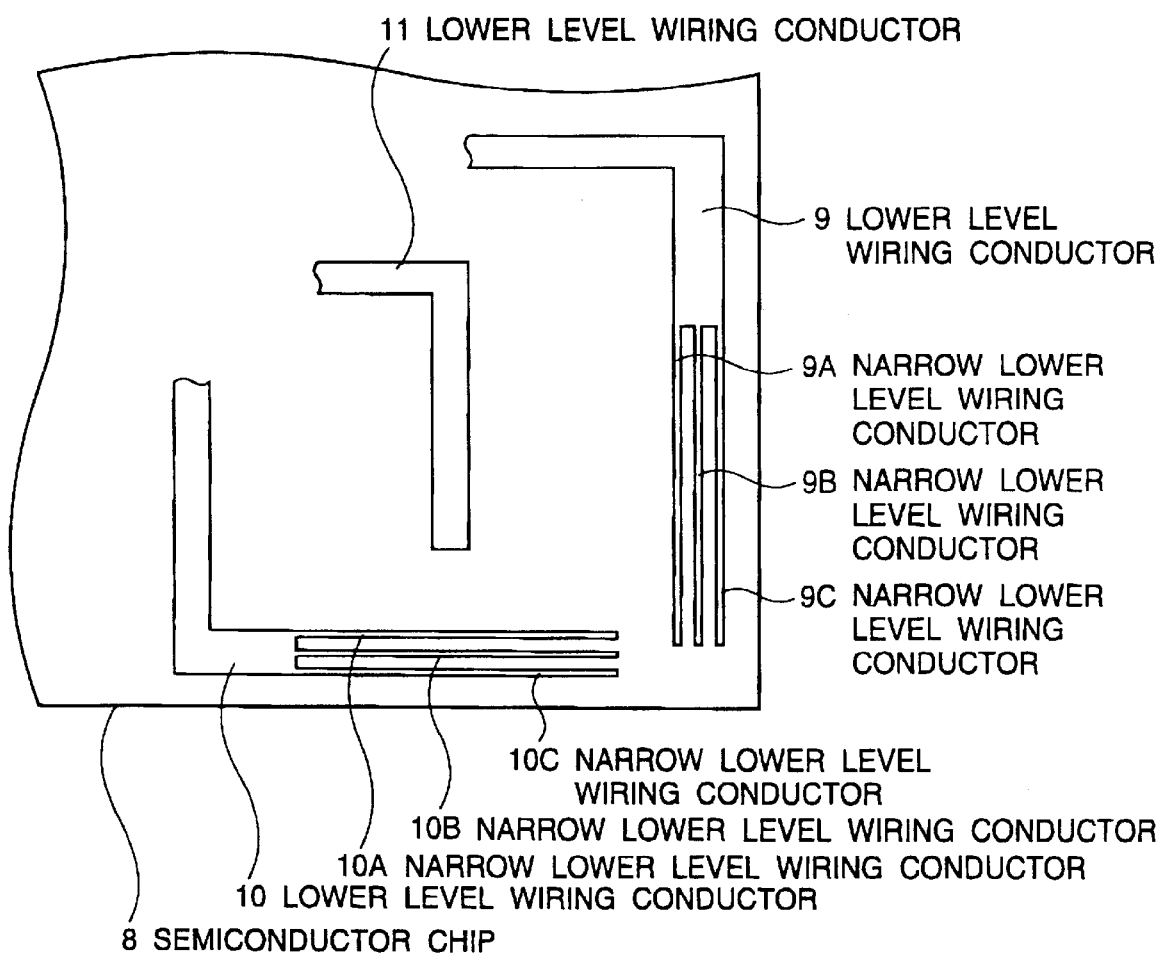

WIRING STRUCTURE WITH DIVIDED WIRING CONDUCTORS TO ACHIEVE PLANARITY IN AN OVERLYING SOG LAYER

BACKGROUND OF THE INVENTION

1. Field of the invention

The present invention relates to a semiconductor device and a method for manufacturing the same, and more specifically to a multilayered wiring structure and a process for forming the same.

2. Description of Related Art

With an advanced microfabrication of the semiconductor device, a micro-multilayered wiring is indispensable to form the semiconductor device. An interlayer insulator film in the semiconductor device having the multilayered wiring structure is mainly formed of a silicon oxide film, which has a small dielectric constant and a stable quality, in order to reduce a parasite capacitance between an upper level wiring layer and a lower level wiring layer and between wiring conductors in the same level.

Because of the microfabrication of the semiconductor device, the width of the lower level wiring conductors and the spacing between adjacent wiring conductors are reduced, but in order to avoid an increase of a wiring resistance, it is necessary to ensure some degree of sectional area of the wiring conductor. As a result, an aspect ratio of wiring conductor ("height of wiring conductor" to "width of wiring conductor") and an aspect ratio of inter-wiring spacing ("height of wiring conductor" to "spacing between adjacent wiring conductors") become large. In addition, it is necessary to fill up a spacing between the lower level wiring conductors with the interlayer insulating film so as to planarize a surface of the interlayer insulating film.

Furthermore, when a large step exists on the surface of the interlayer insulating film, in a photolithographic process for forming the upper level wiring conductor, a fine resist pattern cannot be formed because of a shortage of the focus margin, or even if the fine resist pattern could be formed, disconnection of the upper level wiring conductor and/or an unetched remaining wiring material occur because of the large step. Therefore, it is required that the surface of the interlayer insulating film is planar.

In addition, the interlayer insulating film formed on the metal wiring conductor formed of aluminum is required to be formed at a temperature not higher than 450° C.

A spin-on-glass (SOG) process has been generally used as one typical method for forming the interlayer insulating film formed in a micro-multilayered structure formed of the metal wiring material formed of aluminum. However, this SOG has become difficult to uniformly planarize the whole of the semiconductor chip.

Now, the above mentioned situation will be described with reference to FIGS. 1A to 1C, which are diagrammatic partial sectional views of a semiconductor device for illustrating a process of forming a lower level wiring conductor and an upper level wiring conductor, using the SOG film as a planarizing interlayer insulating film. In FIGS. 1A to 1C, an inside of a semiconductor chip as well as an edge zone and a scribing line zone of the semiconductor chip are shown.

As shown in FIG. 1A, a field oxide film 102 is formed on a silicon substrate 101, and a first level interlayer insulating film 103 is formed on the field oxide film 102 by a chemical vapor deposition (CVD) process. This first level interlayer insulating film 103 is formed of a silicon oxide film.

Then, lower level wiring conductors 104, 104A, 104B and 104C are formed on the first level interlayer insulating film 103. The lower level wiring conductors 104 and 104A are formed in the inside of the semiconductor chip, and the lower level wiring conductor 104B is formed in the chip edge zone. These lower level wiring conductors are formed of for example metal aluminum or metal tungsten, and are used as a power supply line, a ground line or a signal line. This figure shows the power supply line or the ground line having a large line width of 20 μm. Similarly, the lower level wiring conductor 104C formed of aluminum or tungsten, is formed in the scribing line zone of the semiconductor chip, and is connected to the silicon substrate 101.

This lower level wiring conductor 104C is indispensable to prevent generation of a channel leak current under the field oxide film, at a periphery of the semiconductor chip. Incidentally, in a DRAM (dynamic random access memory), this lower level wiring conductor 104C is used as a wiring for a substrate potential generation circuit, or a discharge line for an electro-static discharge (ESD).

Thereafter, a second level interlayer insulating film 105 is formed to cover the lower level wiring conductors. This second level interlayer insulating film 105 is formed of a silicon oxide film having a film thickness of about 300 μm deposited by a plasma CVD process.

Furthermore, an SOG film 106+106a is formed on the second level interlayer insulating film 105. This SOG film is formed by spin-coating an SOG coating solution on the second level interlayer insulating film 105, and then, by heat-treating the spin-coated solution for a thermosetting. For example, this SOG film is formed of an organic silica film.

However, if the SOG film is formed as mentioned above, the film thickness of the SOG film is greatly different between the semiconductor chip inside and the semiconductor chip edge zone. For example, if it is so attempted that the SOG film 106 in the semiconductor chip inside has the film thickness of about 300 μm, the SOG fill 106A in the semiconductor chip edge zone becomes 600 μm. The reason for this is that the SOG film is easy to remain on the lower level wiring conductors in the semiconductor chip edge zone because a surface tension. This phenomenon that the SOG film 106A becomes thick in the semiconductor chip edge zone, becomes more remarkable if the line width of the lower level wiring conductor 104B located in the semiconductor chip edge zone becomes large.

Then, a whole surface of the SOG file is etched back by a dry etching. With this etching-back, the SOG film on the lower level wiring conductors 104 and 104A in the semiconductor chip inside are removed as shown in FIG. 1B. However, the SOG film 106 remains between the lower level wiring conductors 104 and 104A. Thus, the interlayer insulating film is planarized.

In the semiconductor chip edge zone, however, the SOG film 106A remains on the lower level wiring conductors 104B and 104C. This is because the film thickness of the SOG film 106A in the semiconductor chip edge zone is larger than that in the semiconductor chip inside, as mentioned above.

Thereafter, a third level interlayer insulating film 107 is formed by a plasma CVD process. This third level interlayer insulating film 107 is formed of a silicon oxide film having a film thickness of about 400 μm. In the semiconductor chip inside, the third level interlayer insulating film 107 is in direct contact with the second level interlayer insulating film 105 on the lower level wiring conductors 104 and 104A. In the semiconductor chip edge zone, on the other hand, a stacked layer composed of the second level interlayer insulating film, the SOG film and third level interlayer insulating film is formed on the lower level wiring conductors 104B and 104C.

Thereafter, as shown in FIG. 1C, through holes 108 and 108A are formed to penetrate through a stacked interlayer insulating film which is formed on the lower level wiring conductors 104 and 104A and which is composed of the second interlayer insulating film 105 and the third interlayer insulating film 107. Simultaneously, a through hole 108B is formed to penetrate through the stacked layer which is formed on the lower level wiring conductor 104B and which is composed of the second level interlayer insulating film, the SOG film and third level interlayer insulating film.

Furthermore, an upper level wiring conductor 109 is formed to connect through the contact hole 108 to the lower level wiring conductor 104. Similarly, upper level wiring conductors 109A and 109B are formed to connect the lower level wiring conductors 104A and 104B, respectively.

As mentioned above, in the prior art technology, the SOG film in the periphery of the semiconductor chip, namely, in the semiconductor chip edge zone, is formed to become thicker than that in the semiconductor chip inside.

Because of this, the following two significant problems have been encountered.

A first problem is that, the upper level wiring conductor is eroded in a connection portion between the lower level wiring conductor and the upper level wiring conductor within the semiconductor chip edge zone, so that an electrical connection between the lower level wiring conductor and the upper level wiring conductor is deteriorated. As a result, reliability of the semiconductor device greatly lowers.

The deterioration of the electrical connection is considered to have been caused as follows: As mentioned above, in the semiconductor chip edge zone, the SOG film remains on the lower level wiring conductor having the large line width. Therefore, the SOG film is exposed at a side wall of the through hole 108B. On the other hand, the SOG film is high in moisture absorption and therefore is easy to contain moisture. The moisture contained in the SOG film will erode the upper level wiring conductor within the through hole 108B, to ultimately cause disconnection of the wiring conductor or elevation of the wiring resistance.

In order to overcome this problem, Japanese Patent Application Pre-examination Publication No. JP-A-5-206284 (the content of the which is incorporated by reference in its entirety into this application, and also an English abstract of JP-A-5-206284 is available from the Japanese Patent Office and the content of the English abstract of JP-A-5-206284 is also incorporated by reference in its entirety into this application) proposes a method in which the SOG film is not exposed at the side wall of the through hole. However, the advantage of this proposed method becomes lost if the line width of the wiring conductor becomes large.

A second problem is that, coverage of the upper level wiring conductor is deteriorated also in the connection portion between the lower level wiring conductor and the upper level wiring conductor within the semiconductor chip edge zone, with the result that the electrical connection becomes difficult.

The reason for this is that: as mentioned above, in the semiconductor chip edge zone, since the SOG film remains on the lower level wiring conductor having the large line width, the through hole 108B becomes deep and therefore, the aspect ratio of the through hole 108B becomes large.

SUMMARY OF THE INVENTION

Accordingly, it is an object of the present invention to provide a semiconductor device and a method for manufacturing the same, which has overcome the above mentioned defect of the conventional one.

Another object of the present invention is to provide a semiconductor device and a method for manufacturing the same, which can realize a high reliability and a high yield of production by preventing an increase of the film thickness of the SOG film in the semiconductor chip edge zone.

The above and other objects of the present invention are achieved in accordance with the present invention by a wiring structure for a semiconductor device comprising a semiconductor substrate, a first interlayer insulating film formed on the semiconductor substrate, first level wiring conductors formed on the first interlayer insulating film, a second interlayer insulating film formed to cover the first level wiring conductors and including a SOG film, and second level wiring conductors formed on the second interlayer insulating film, wherein a first level wiring conductor which is formed in a peripheral zone of a semiconductor chip and which has to have a wide line width, is divided into a plurality of divided wiring conductors having a narrow line width, and therefore, is constituted of a set of the divided wiring conductors having the narrow line width.

According to another aspect of the present invention, there is provided a wiring structure for a semiconductor device comprising a semiconductor substrate, a first interlayer insulating film formed on the semiconductor substrate, first level wiring conductors formed on the first interlayer insulating film, a second interlayer insulating film formed to cover the first level wiring conductors and including a SOG film, and second level wiring conductors formed on the second interlayer insulating film, wherein the first interlayer insulating film in a peripheral zone of a semiconductor chip is etched by a predetermined thickness so that the first level wiring conductor located in the peripheral zone of the semiconductor chip is formed at a level lower than the first interlayer insulating film located in an inside of the semiconductor chip.

Here, the peripheral zone of the semiconductor chip is a zone extending from an edge of the semiconductor chip toward the inside of the semiconductor chip by 100 $\mu$m.

The divided wiring conductors having the narrow line width, have a line width of not greater than 10 $\mu$m.

In the peripheral zone of the semiconductor chip, the first level wiring conductor and the second level wiring conductor are connected to each other through a contact hole formed to penetrate through the second interlayer insulating film formed on the divided wiring conductor having the narrow line width, and no SOG film exists in the second interlayer insulating film exposed at a side wall of the contact hole.

In order to form the wiring structure in accordance with the first aspect of the present invention, according to a third aspect of the present invention there is provided a process for forming the wiring structure of the semiconductor device, comprising the steps of forming a first interlayer insulating film on a semiconductor substrate, forming, on the first interlayer insulating film, first level wiring conductors including divided wiring conductors having a narrow line width formed on the first interlayer insulating film in a peripheral zone of a semiconductor chip, forming a first insulating film to cover the first level wiring conductors and the first interlayer insulating film, forming an SOG film to cover the first insulating film, etching back the SOG film by a predetermined thickness to expose the first insulating film on the first level wiring conductors, forming a second insulating film to cover the first insulating film and the remaining SOG film, so that a second interlayer insulating film is constituted of the first insulating film and the second insulating film on the first level wiring conductors and of the first insulating film, the SOG film and the second insulating film on the other portion, and forming a second wiring conductor on the second insulating film.

In order to form the wiring structure in accordance with the second aspect of the present invention, according to a fourth aspect of the present invention there is provided a process for forming the wiring structure of the semiconductor device, comprising the steps of forming a first interlayer insulating film on a semiconductor substrate, removing the first interlayer insulating film by a predetermined depth in a peripheral zone of a semiconductor chip, forming first level wiring conductors on the first interlayer insulating film, forming a first insulating film to cover the first level wiring conductors and the first interlayer insulating film, forming an SOG film to cover the first insulating film, etching back the SOG film by a predetermined thickness to expose the first insulating film on the first level wiring conductors, forming a second insulating film to cover the first insulating film and the remaining SOG film, so that a second interlayer insulating film is constituted of the first insulating film and the second insulating film on the first level wiring conductors and of the first insulating film, the SOG film and the second insulating film on the other portion, and forming a second wiring conductor on the second insulating film.

The above and other objects, features and advantages of the present invention will be apparent from the following description of preferred embodiments of the invention with reference to the accompanying drawings.

BRIEF DESCRIPTION OF THE DRAWINGS

FIG. 3 is a diagrammatic plan view illustrating the lower level wiring conductors in the first embodiment of the wiring structure in accordance with the present invention;

DESCRIPTION OF THE PREFERRED EMBODIMENTS

Now, a first embodiment of the present invention will be described with reference to FIGS. 2A to 2B and FIG. 3.

Similarly to the prior art example shown in FIGS. 1A to 1C, FIGS. 2A to 2B show an inside of a semiconductor chip as well as an edge zone and a scribing line zone of the semiconductor chip.

Figure 1A:
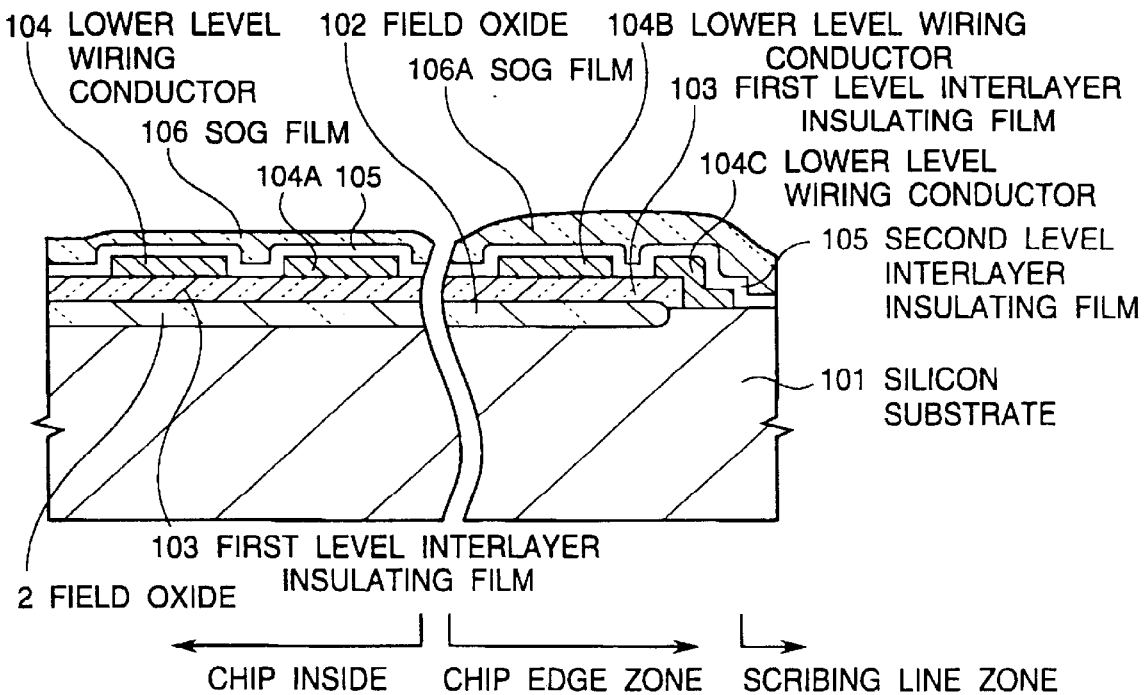
FIGS. 1A to 1C are diagrammatic partial sectional views of a semiconductor device for illustrating a prior art process of forming a lower level wiring conductor and an upper level wiring conductor, using the SOG film as a planarizing interlayer insulating film.
Figure 1B:
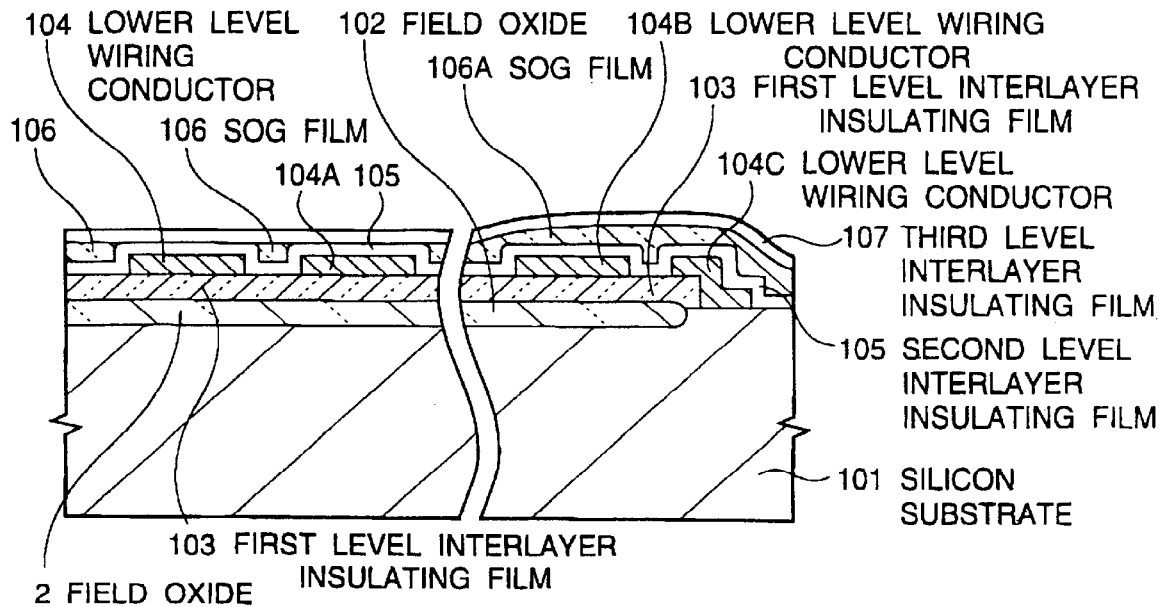
Figure 1C:
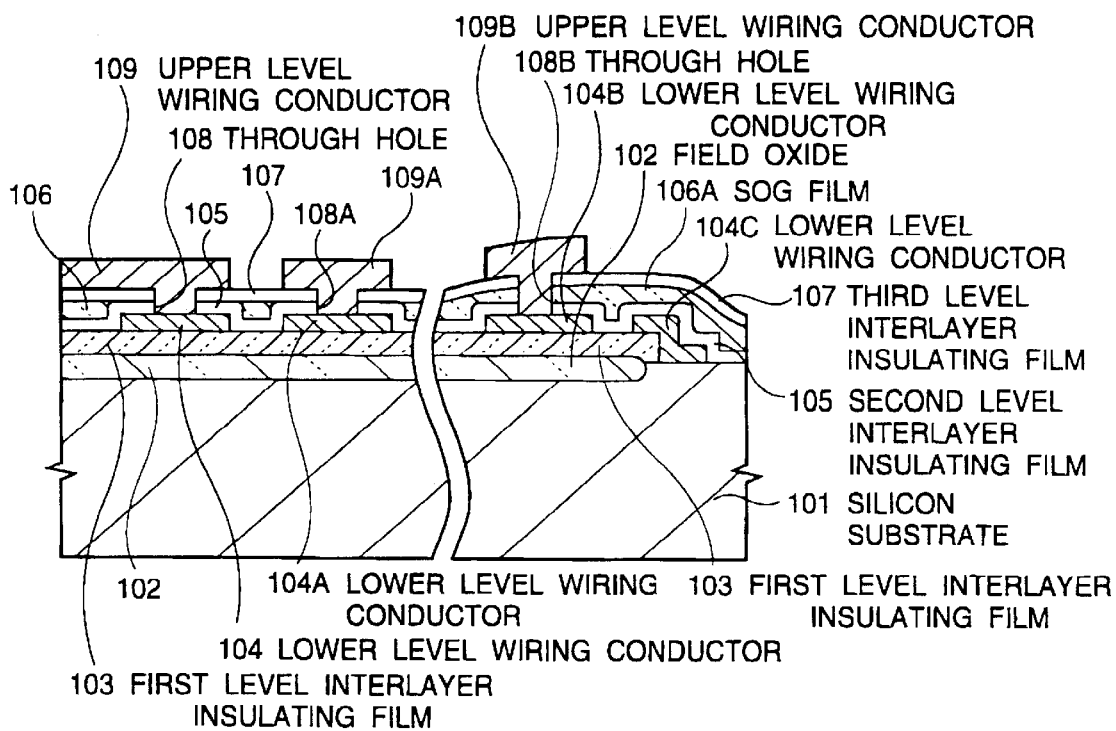
Figure 2A:
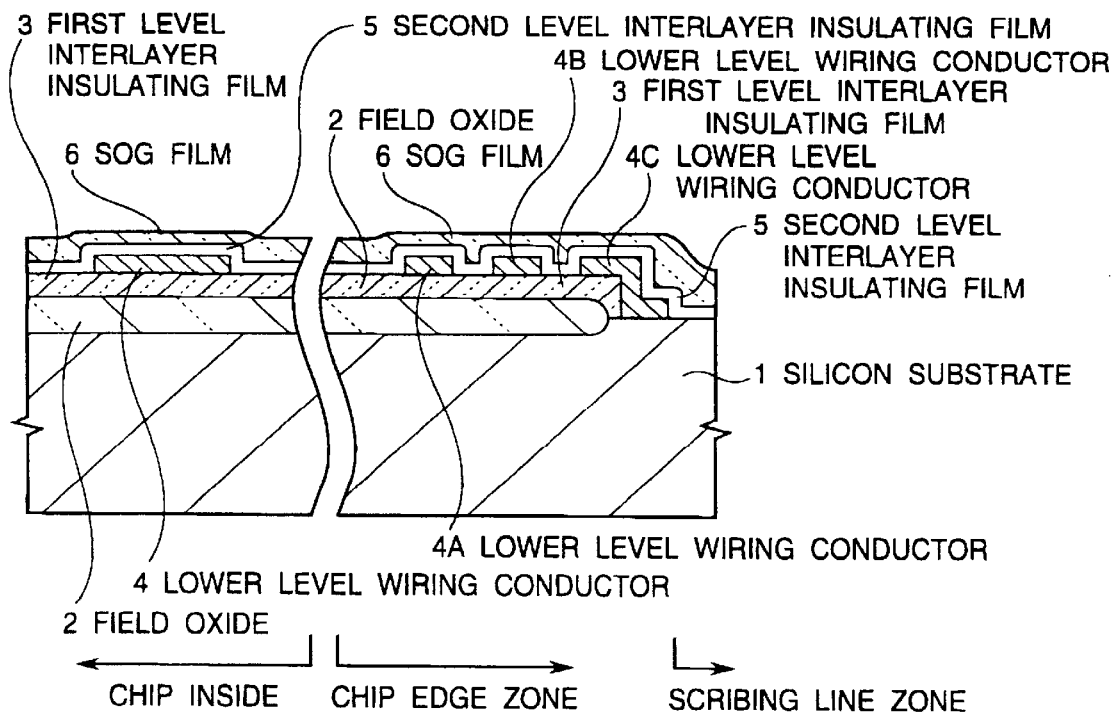
FIGS. 2A to 2C are diagrammatic partial sectional views of a semiconductor device for illustrating a first embodiment of the process in accordance with the present invention for forming a first embodiment of the wiring structure in accordance with the present invention.

As shown in FIG. 2A, a field oxide film 2 is formed on a silicon substrate 1. This field oxide film 2 is formed of a silicon oxide film having a thickness of about 400 nm. A first level interlayer insulating film 3 is formed on the field oxide film 2 by a CVD process. This first level interlayer insulating film 3 is formed of a silicon oxide film having a thickness of about 300 nm. A first interlayer insulating film is constituted of the field oxide film 2 and the first level interlayer insulating film 3.

Then, lower level wiring conductors 4, 4A, 4B and 4C are formed on the first level interlayer insulating film 3. The lower level wiring conductor 4 is formed in the inside of the semiconductor chip, and the lower level wiring conductors 4A, 4B and 4C formed in the chip edge zone. These lower level wiring conductors are formed of a metal aluminum film having a thickness of about 400 nm. The lower level wiring conductor 4 has a line width of about 20 $\mu$m. On the other hand, the lower level wiring conductors 4A and 4B have a line width of about 5 $\mu$m, and a spacing between the lower level wiring conductors 4A and 4B is set to be about 10 $\mu$m.

Thereafter, a second level interlayer insulating film 5 is formed to cover the lower level wring conductors. This second level interlayer insulating film 5 constitutes a first insulating film. The second level interlayer insulating film 5 is formed of a silicon oxide film having a film thickness of about 400 $\mu$m deposited by a plasma CVD process Furthermore, an SOG film 6 is formed on the second level interlayer insulating film 5. This SOG film is formed similarly to the prior art process. Namely, the SOG film 6 is formed by spin-coating an SOG coating solution on the second level interlayer insulating film 5, and then, by heat-treating the spin-coated solution for a thermosetting. For example, this SOG film is formed of an organic silica film.

As mentioned above, in the present invention, the line width of the lower level wiring conductors in the semiconductor chip edge zone is made small, and the SOG film is formed to cover the lower level wiring conductors 4, 4A, 4B and 4C including the small line width wiring conductors 4A and 4B. With this arrangement, the film thickness of the SOG film become substantially equal between the semiconductor chip inside and the semiconductor chip edge zone. For example, if the film thickness of the SOG film in the semiconductor chip inside was set to be about 350 nm, the film thickness of the SOG film in the semiconductor chip edge zone became about 380 nm. This is because the line width of the lower level wiring conductors 4A and 4B was narrowed to about 5 $\mu$m, as will be explained hereinafter.

Then, a whole surface of the SOG file is etched back by a dry etching. With this etching-back, the SOG film on the lower level wiring conductor 4 in the semiconductor chip inside are removed as shown in FIG. 2B. In this embodiment, the SOG film 6 on the lower level wiring conductors 4A and 4B is also removed. Accordingly, the SOG film 6 remains between the lower level wiring conductors. Thus, the interlayer insulating film is planarized.

Thereafter, a third level interlayer insulating film 7 is formed by a plasma CVD process. This third level interlayer insulating film 7 constitutes a second insulating film. The third level interlayer insulating film 7 is formed of a silicon oxide film having a film thickness of about 400 $\mu$m. On the lower level wiring conductor 4 in the semiconductor chip inside, and on the lower level wiring conductors 4A and 4B in the semiconductor chip edge zone, the third level interlayer insulating film 7 is in direct contact with the second level interlayer insulating film 5. Accordingly, a second interlayer insulating film is constituted of the second level interlayer insulating film 5 and the third level interlayer insulating film 7 on the lower level wiring conductors, and of the second level interlayer insulating film 5, the SOG film 6 and the third level interlayer insulating film 7 on the other portion.

Figure 2B:
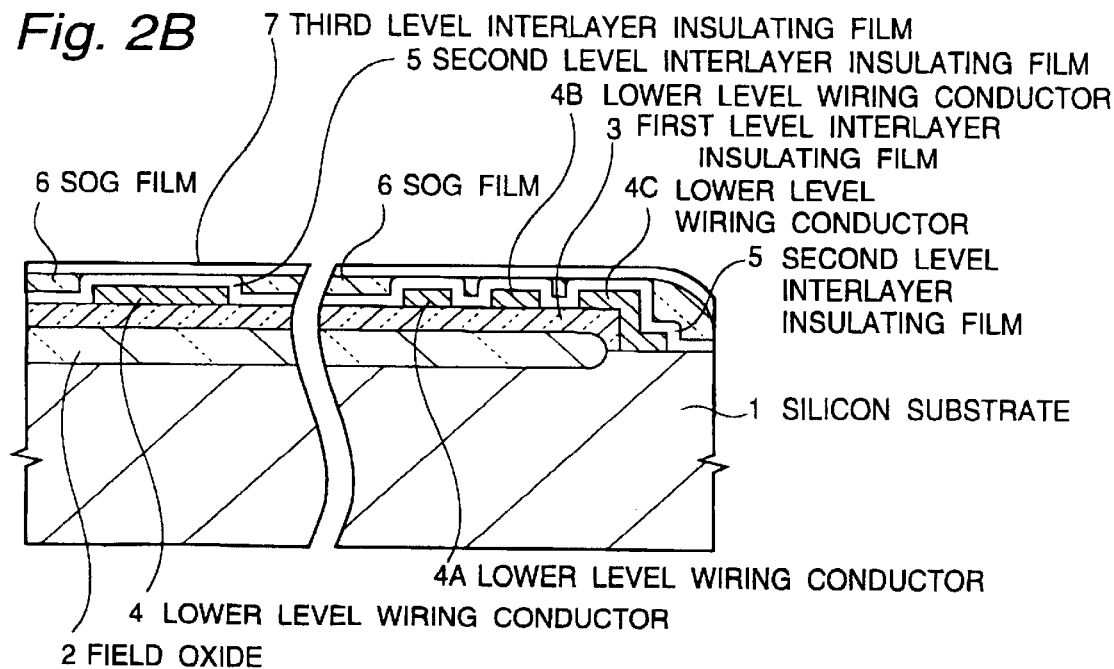

Here, referring to FIG. 3, there is shown a diagrammatic plan view illustrating the lower level wiring conductors shown in FIG. 2B. As shown in FIG. 3, lower level wiring conductors 9 and 10 are located in an edge zone of a semiconductor chip 8. The lower level wiring conductor 9 is divided into for example three lower level wiring conductors 9A, 9B and 9C having a narrow line width and extending along the edge zone of the semiconductor chip 8, and similarly, the lower level wiring conductor 10 is divided into for example three lower level wiring conductors 10A, 10B and 10C having a small line width and extending along the edge zone of the semiconductor chip 8. In these lower level wiring conductors 9 and 10, a portion which does not extend along the edge zone of the semiconductor chip 8, are maintained to have a large line width as it is. On the other hand, a lower level wiring conductor 11 in the semiconductor chip inside is not divided into narrow wiring conductors.

As will be described later, through holes are formed in the interlayer insulating film on the narrow lower level wiring conductors 9A, 9B and 9C and 10A, 10B and 10C of the lower level wiring conductors 9 and 10, but no through holes is formed in the interlayer insulating film on the portion of the lower level wiring conductors 9 and 10 which extends along the edge zone of the semiconductor chip 8 but which is maintained to have a large line width as it is.

Figure 2C:
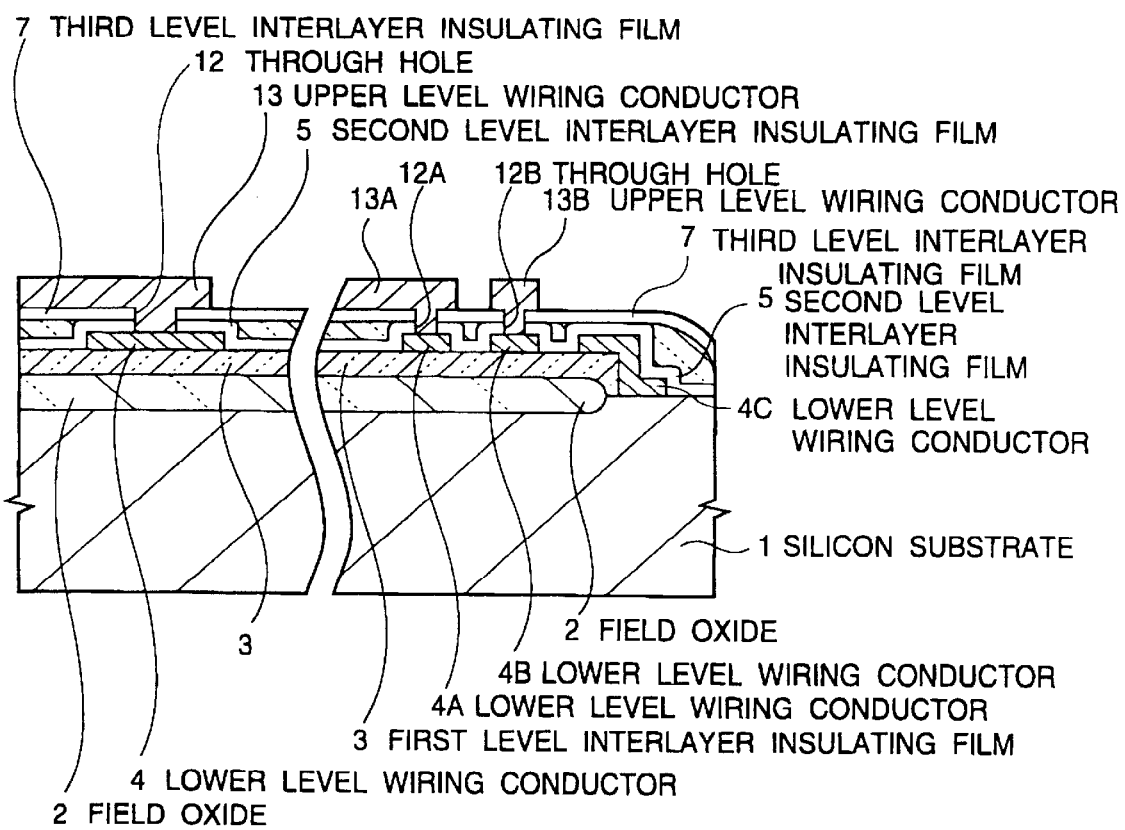

Thereafter, as shown in FIG. 2C, through holes 12, 12A and 12B are formed to penetrate through a stacked interlayer insulating film which is formed on the lower level wiring conductors 4, 4A and 4B and which is composed of the second interlayer insulating film 5 and the third interlayer insulating film 7. Furthermore, an upper level wiring conductor 13 is formed to connect through the contact hole 12 to the lower level wiring conductor 4. Similarly, upper level wiring conductors 13A and 13B are formed to connect the lower level wiring conductors 4A and 4B, respectively. These upper level wiring conductors are formed of a metal aluminum film having a thickness of about 800 nm.

As mentioned above, the multilayered wiring structure is so constructed that the first level interlayer insulating film 3 is formed on the field oxide film 2 formed on the silicon substrate 1, and the lower level wiring conductor 4 in the semiconductor chip inside is not divided into narrow wiring conductors, but the lower level wiring conductor in the semiconductor chip edge zone is not divided into narrow wiring conductors 4A, 4B and 4C.

Now, an advantage of the present invention will be described with reference to FIGS. 4 and 5, which illustrate reliability of the wiring structure when the lower level wiring conductor and the upper level wiring conductor are connected to each other through a through hole formed in an interlayer insulating film including an SOG film. This reliability of the wiring structure was evaluated by an accelerated test.

Figure 4:
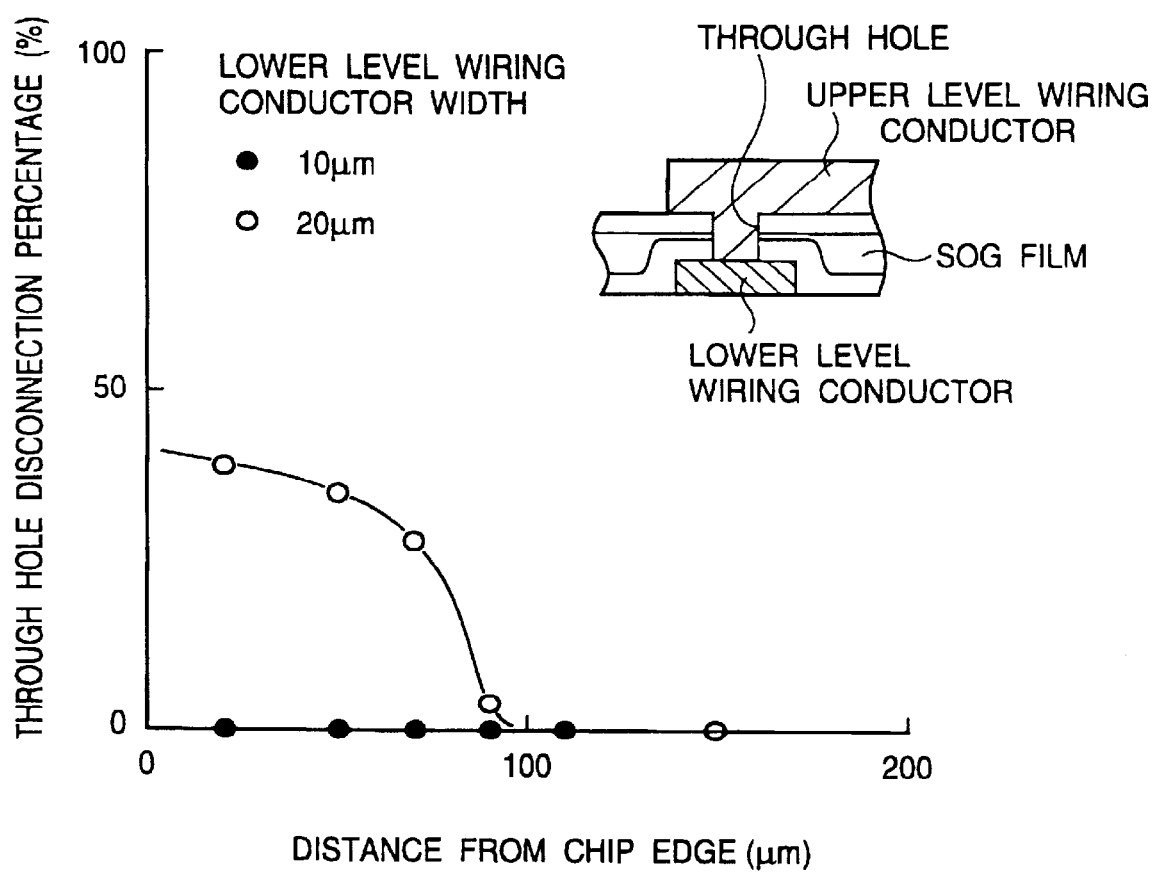
FIGS. 4 and 5 graphs showing the reliability of the wiring structure in accordance with the present invention.

In the graph of FIG. 4, the axis of ordinates shows a distance from the edge of the semiconductor chip to the lower level wiring conductor, and the axis of abscissas shows a through-hole disconnection percentage. The graph of FIG. 4 shows the case of the lower level wiring conductor width of 10 μm and the case of the lower level wiring conductor width of 20 μm.

As shown in FIG. 4, in the case of the lower level wiring conductor width of 20 μm, the through-hole disconnection occurs in a zone of 100 μm from the edge of the semiconductor chip, and on the other hand, the through-hole disconnection percentage becomes zero in a region exceeding 100 μm from the edge of the semiconductor chip. In addition, the larger the line width of the lower level wiring conductor becomes, the larger the through-hole disconnection percentage becomes. However, the through-hole disconnection percentage becomes zero if the distance from the edge of the semiconductor chip to the lower level wiring conductor exceeds 100 μm. This means that, if the lower level wiring conductor located in the semiconductor chip edge zone, which does not exceed 100 μm from the edge of the semiconductor chip, is divided into narrow line width wiring conductors, the reliability of the wiring is remarkably improved. However, if the line width of the lower level wiring conductor becomes not larger than 10 μm, the through-hole disconnection percentage becomes zero regardless of the distance from the edge of the semiconductor chip.

Figure 5:
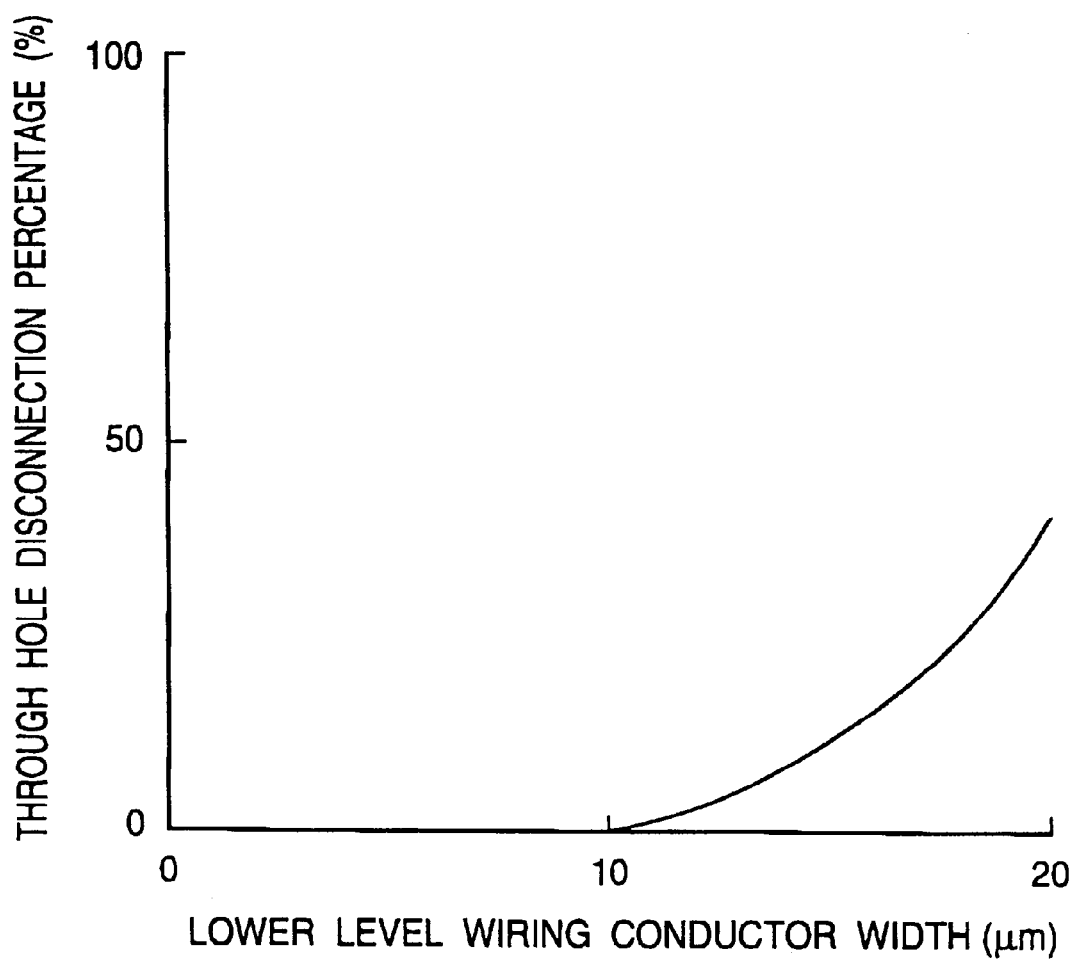

In the graph of FIG. 5, the axis of ordinates shows the line width of the lower level wiring conductor, and the axis of abscissas shows a through-hole disconnection percentage. In this test, the lower level wiring conductor is located in a zone which is separated inwardly from the edge of the semiconductor chip by 10 μm. As seen from FIG. 5, the larger the line width of the lower level wiring conductor becomes, the larger the through-hole disconnection percentage becomes. However, the through-hole disconnection percentage becomes completely zero if the line width of the lower level wiring conductor becomes not larger than 10 μm.

Figure 6:
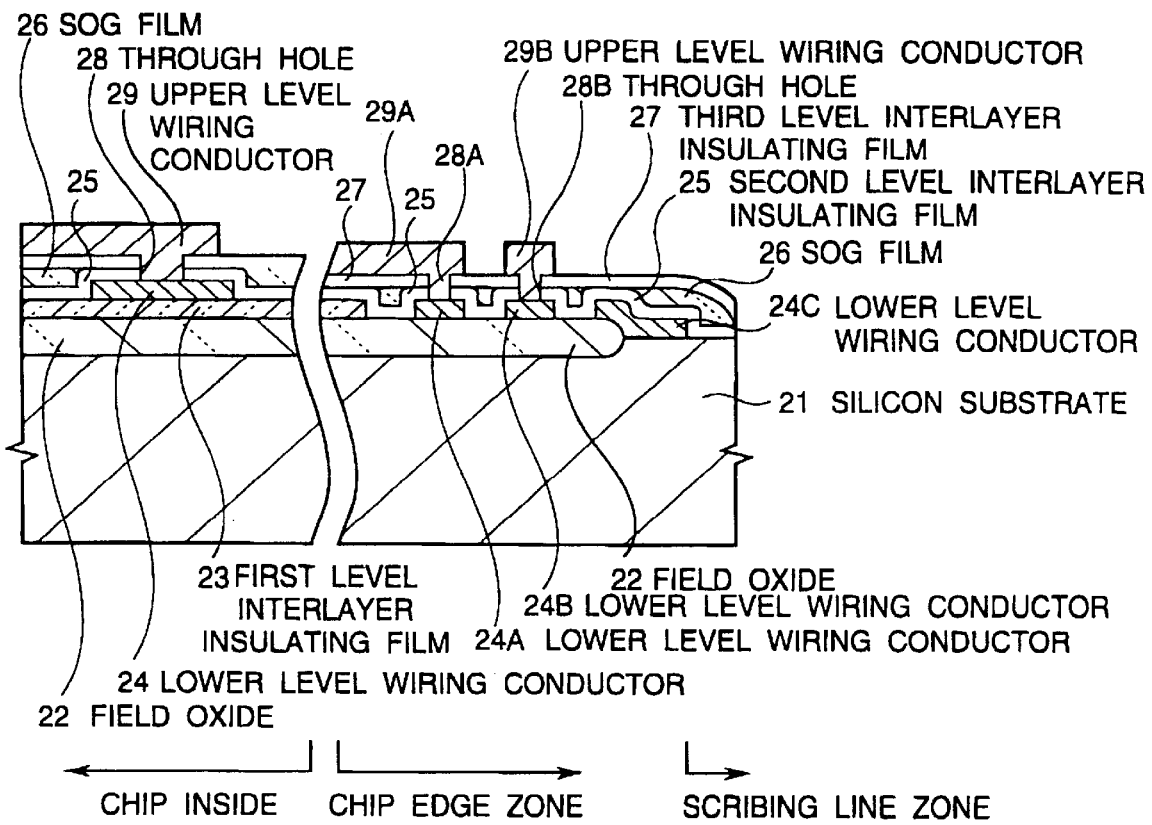
FIG. 6 is a diagrammatic partial sectional view of a semiconductor device for illustrating a second embodiment of the wiring structure in accordance with the present invention.

Next, a second embodiment of the present invention will be described with reference to FIG. 6, which is a diagrammatic partial sectional view of a semiconductor device for illustrating the second embodiment of the wiring structure in accordance with the present invention. FIG. 6 shows an inside of a semiconductor chip as well as an edge zone and a scribing line zone of the semiconductor chip.

As shown in FIG. 6, a field oxide film 22 is formed on a silicon substrate 21. This field oxide film 22 is formed of a silicon oxide film having a thickness of about 600 nm. A first level interlayer insulating film 23 is formed on the field oxide film 22 by a CVD process. This first level interlayer insulating film 23 is formed of a silicon oxide film having a thickness of about 200 nm. Here, the first level interlayer insulating film 23 in the semiconductor chip edge zone is removed.

Then, a lower level wiring conductor 24 is formed on the first level interlayer insulating film 23. The lower level wiring conductor 24 is formed in the inside of the semiconductor chip. Furthermore, lower level wiring conductors 24A and 24B are formed on the field oxide film 22 in the semiconductor chip edge zone. A lower level wiring conductor 24C is formed to bridge the field oxide film 22 and the silicon substrate 21 in contact with the field oxide film 22 and the silicon substrate 21. These lower level wiring conductors are formed of a metal aluminum film having a thickness of about 700 nm. The lower level wiring conductor 4 has a line width of about 20 μm. On the other hand, the lower level wiring conductors 4A and 4B in the semiconductor chip edge zone have a line width of about 10 μm, and a spacing between the lower level wiring conductors 4A and 4B is set to be about 5 μm.

Thereafter, a second level interlayer insulating film 25 is formed to cover these lower level wiring conductors. This second level interlayer insulating film 25 is formed of a silicon oxide film having a film thickness of about 300 µm deposited by a plasma CVD process.

Furthermore, an SOG film 26 is formed on the second level interlayer insulating film 25. This SOG film is formed similarly to the prior art process. Then, a whole surface of the SOG file is etched back by a dry etching. With this etching-back, the SOG film on the lower level wiring conductors 24, 24A and 24B are removed. Thus, the interlayer insulating film is planarized.

Thereafter, a third level interlayer insulating film 27 is formed by a plasma CVD process. This third level interlayer insulating film 27 is formed of a silicon oxide film having a film thickness of about 300 µm. On the lower level wiring conductor 24 in the semiconductor chip inside, and on the lower level wiring conductors 24A and 24B in the semiconductor chip edge zone, the third level interlayer insulating film 27 is in direct contact with the second level interlayer insulating film 25.

Thereafter, through holes 28, 28A and 28B are formed to penetrate through a stacked interlayer insulating film which is formed on the lower level wiring conductors 24, 24A and 24B and which is composed of the second interlayer insulating film 25 and the third interlayer insulating film 27. Furthermore, an upper level wiring conductor 29 is formed to connect through the contact hole 28 to the lower level wiring conductor 24. Similarly, upper level wiring conductors 29A and 29B are formed to connect the lower level wiring conductors 24A and 24B, respectively. These upper level wiring conductors are formed of a metal aluminum film having a thickness of about 1 µm.

As mentioned above, the multilayered wiring structure of the second embodiment is so constructed that the first level interlayer insulating film is selectively removed in the semiconductor chip edge zone and the lower level wiring conductors in the semiconductor chip edge zone are formed at a level lower than that of the lower level wiring conductor in the semiconductor chip inside. Therefore, the SOG film is formed more uniformly in the inside and the edge zone of the semiconductor chip, than the first embodiment. In addition, the line width of the lower level wiring conductor can be made wider than that of the first embodiment, and also the thickness of the lower level wiring conductor can be made thicker than that of the first embodiment.

As mentioned above, according to the present invention, it is possible to form the SOG film in the semiconductor chip periphery, namely in the semiconductor chip edge zone, to have a thickness comparable to that of the SOG film in the semiconductor chip inside.

Therefore, it is possible to eliminate the problem of the prior art, namely, the eroding of the upper level wiring conductor at the connection between the lower level wiring conductor and the upper level wiring conductor, which would otherwise result in deterioration of the electrical connection between the lower level wiring conductor and the upper level wiring conductor. Therefore, reliability of the semiconductor device can be greatly improved.

Furthermore, the interlayer insulating film (composed of the second and third level interlayer insulating film) through which a through hole is formed for connection between the lower level wiring conductor and the upper level wiring conductor, becomes completely equal both in the semiconductor chip edge zone and in he semiconductor chip inside. Therefore, it is possible to prevent deterioration of coverage of the upper level wiring conductor in the semiconductor chip edge zone, which had occurred in the prior art, and therefore, it is possible to avoid the problem in which the electrical connection becomes difficult.

Accordingly, the present invention can provide the semiconductor device having a high reliability and the manufacturing process therefor capable of realizing a high yield of production.

The invention has thus been shown and described with reference to the specific embodiments. However, it should be noted that the present invention is in no way limited to the details of the illustrated structures but changes and modifications may be made within the scope of the appended claims.

What is claimed is:

1. A wiring structure for a semiconductor device comprising a semiconductor substrate (21), a field oxide film (22) formed on the semiconductor substrate, a first interlayer insulating film (23) formed on the field oxide film, first level wiring conductors (24, 24A, 24B) formed on the first interlayer insulating film and positioned above only the field oxide film, a second interlayer insulating film (25+26+27) formed to cover the first level wiring conductors and including a SOG film (26), and second level wiring conductors (29, 29A, 29B) formed on the second interlayer insulating film, wherein a first level wiring conductor (24A+24B) which is formed in a peripheral chip edge zone of a semiconductor chip and which has to have a wide line width divided into a plurality of divided wiring conductors (24A, 24B) having a narrow line width, and therefore, is constituted of a set of the divided wiring conductors (24A, 24B) having the narrow line width, and wherein the first interlayer insulating film (23) in said peripheral chip edge zone of said semiconductor chip is etched by a predetermined thickness so that said plurality of divided wiring conductors (24A, 24B) of said first level wiring conductor located in said peripheral chip edge zone of said semiconductor chip are formed at a level lower than the first level wiring conductor (24) located in an inside chip area of said semiconductor chip.

2. A wiring structure claimed in claim 1 wherein the peripheral zone of the semiconductor chip is a zone extending from an edge of the semiconductor chip toward the inside of the semiconductor chip by 100 µm.

3. A wiring structure claimed in claim 1 wherein the divided wiring conductors having the narrow line width, have a line width of not greater than 10 µm.

4. A wiring structure claimed in claim 1 wherein in the peripheral zone of the semiconductor chip, the first level wiring conductor and the second level wiring conductor are connected to each other through a contact hole formed to penetrate through the second interlayer insulating film formed on the divided wiring conductor having the narrow line width, and no SOG film exists in the second interlayer insulating film exposed at a side wall of the contact hole.

5. A wiring structure for a semiconductor device comprising:
 a semiconductor substrate (21),
 an insulating layer (22) formed on the semiconductor substrate;
 a first interlayer insulating film 23 formed on the insulating layer (22),
 first level wiring conductors (24, 24A, 24B) formed on the first interlayer insulating film,
 a second interlayer insulating film (25+26+27) formed to cover the first level wiring conductors and including a SOG film (26), and
 second level wiring conductors (29, 29A, 29B) formed on the second interlayer insulating film, wherein the first interlayer insulating film (23) in a peripheral zone of a semiconductor chip is removed and the first level wiring conductor (24A, 24B) located in the peripheral zone of the semiconductorchip is formed directly on the insulating layer (22), so that the first level wiring conductor (24A, 24B) located in the peripheral zone of the semiconductor chip is formed at a level lower than the first level wiring conductor (24) in an inside chip area of the semiconductor chip.

6. A wiring structure claimed in claim 5 wherein the peripheral zone of the semiconductor chip is a zone extending from an edge of the semiconductor chip toward the inside of the semiconductor chip by 100 $\mu$m.

7. A wiring structure claimed in claim 6 wherein the first level wiring conductor's (24, 24A, 24B) are divided wiring conductors having a narrow line width, with a line width of not greater than 10 $\mu$m.

8. A wiring structure claimed in claim 6 wherein in the peripheral zone of the semiconductor chip, a contact hole is formed between the first level wiring conductor and the second level wiring conductor which are connected to each other through said contact hole which is formed to penetrate through the second interlayer insulating film formed on a divided wiring conductor having narrow line widths, and the second interlayer insulating film is free of a SOG film exposure at a side wall of the contact hole.

* * * * *